United States Patent [19]
Kawamoto

[11] Patent Number: 5,867,027
[45] Date of Patent: Feb. 2, 1999

[54] MAGNETIC RESONANCE IMAGING APPARATUS

[75] Inventor: Hiromi Kawamoto, Yaita, Japan

[73] Assignee: Kabushiki Kaisha Toshiba, Kawasaki, Japan

[21] Appl. No.: 687,205

[22] Filed: Jul. 25, 1996

[30] Foreign Application Priority Data

Jul. 23, 1996 [JP] Japan ................................ 8-193476
Jul. 27, 1996 [JP] Japan ................................ 7-191612

[51] Int. Cl.$^6$ ........................................ G01V 3/00
[52] U.S. Cl. ............................. 324/322; 324/318
[58] Field of Search ............................. 324/318, 319, 324/320, 322, 300; 600/422

[56] References Cited

U.S. PATENT DOCUMENTS

| | | | |
|---|---|---|---|
| 4,733,189 | 3/1988 | Punchard et al. | 324/318 |
| 4,737,716 | 4/1988 | Roemer et al. | 324/319 |
| 4,890,082 | 12/1989 | Fujita | 324/320 |
| 4,924,186 | 5/1990 | Kawamoto et al. | 324/320 |
| 4,978,920 | 12/1990 | Mansfield et al. | 324/318 |
| 5,329,266 | 7/1994 | Soeldner et al. | 324/319 |
| 5,488,299 | 1/1996 | Kondo et al. | 324/318 |

*Primary Examiner*—Louis Arana
*Attorney, Agent, or Firm*—Limbach & Limbach LLP

[57] ABSTRACT

In a magnetic resonance imaging apparatus, gradient magnetic fields and a radiofrequency magnetic field are applied to a subject placed in a static magnetic field to excite nucleuses and generate magnetic resonance signals. A magnetic resonance image is reconstructed on the basis of the magnetic resonance signals. The gradient magnetic fields are produced by gradient coils. A very high-speed imaging method such as an echo planar method requires shield coils to magnetically shield, to the outside, the magnetic fields generated by the primary coils. It is very difficult to drive the primary coils and the shield coils by one amplifier to raise gradient magnetic fields having a relatively high strength within a short period of time. The primary coils and the shield coils are divided into a plurality of groups, and currents are individually supplied to the plurality of groups to allow to raise the gradient magnetic fields having a relatively high strength within the short period of time.

42 Claims, 16 Drawing Sheets

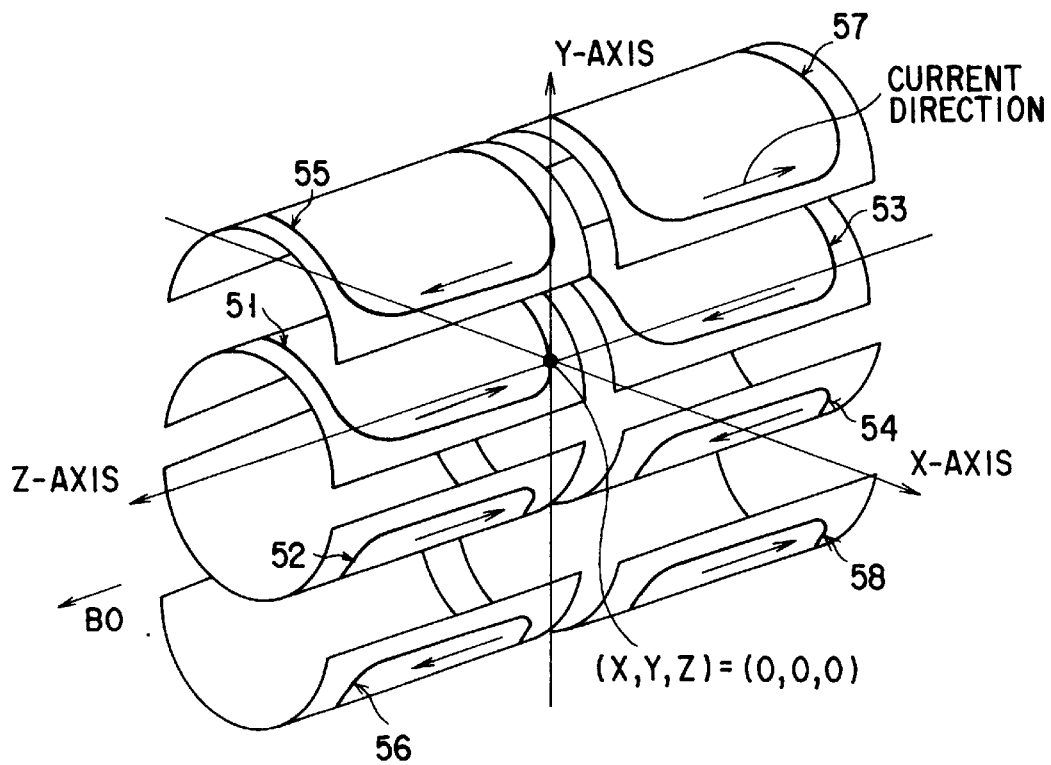
F I G. 3

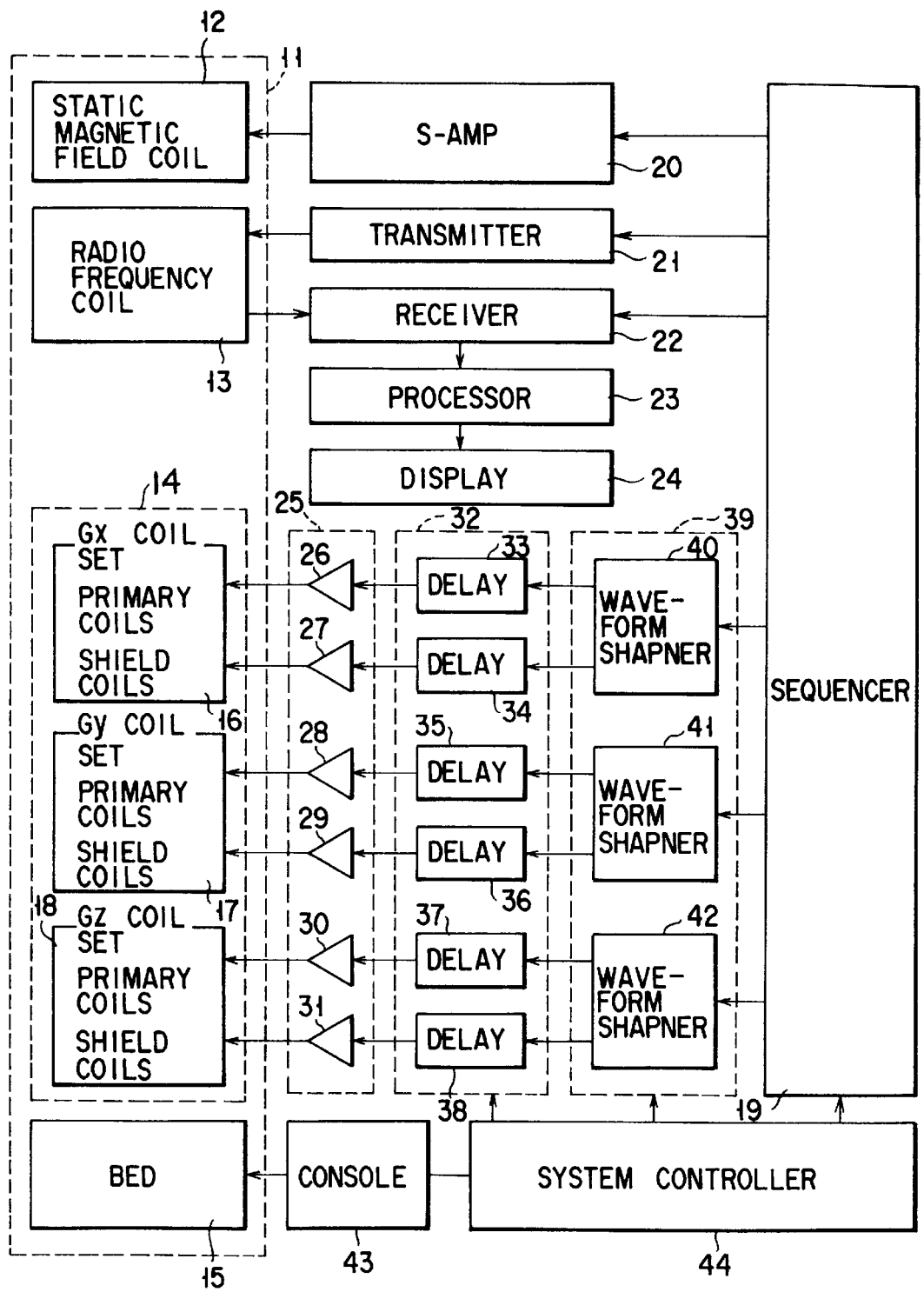
F I G. 2

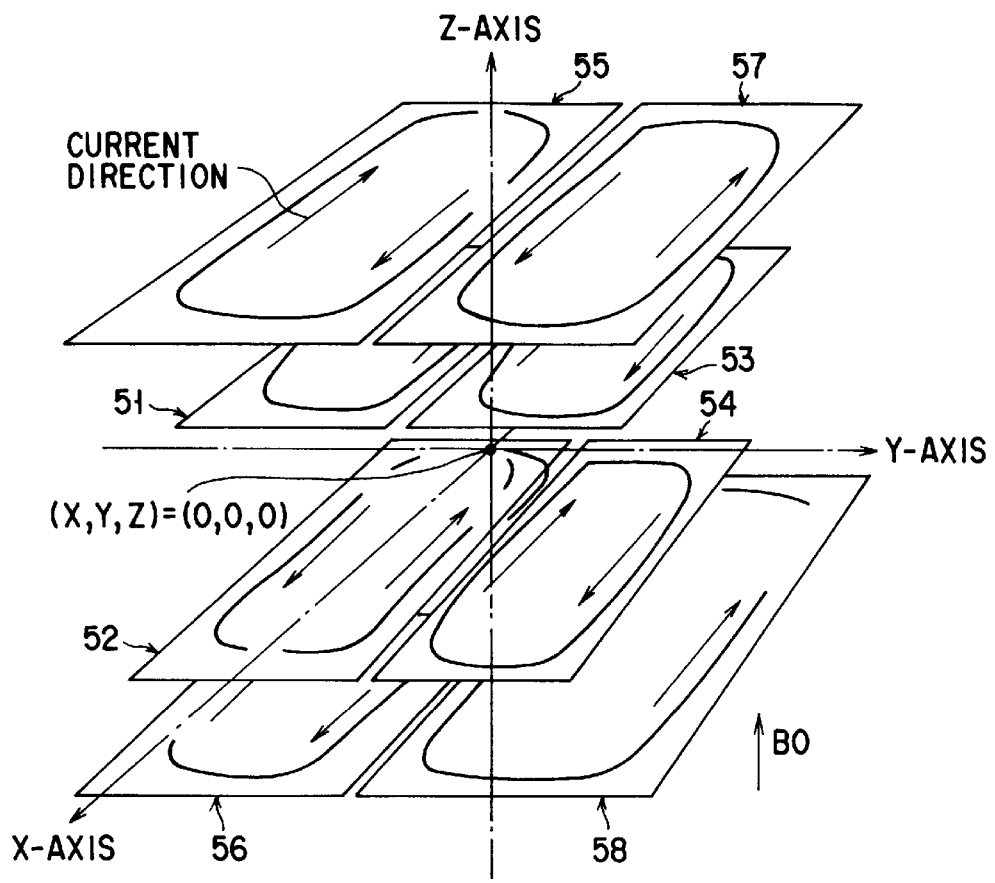
F I G. 4
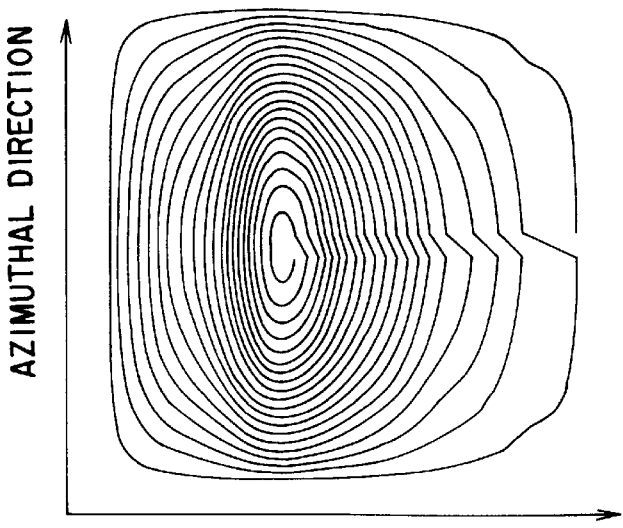
F I G. 5

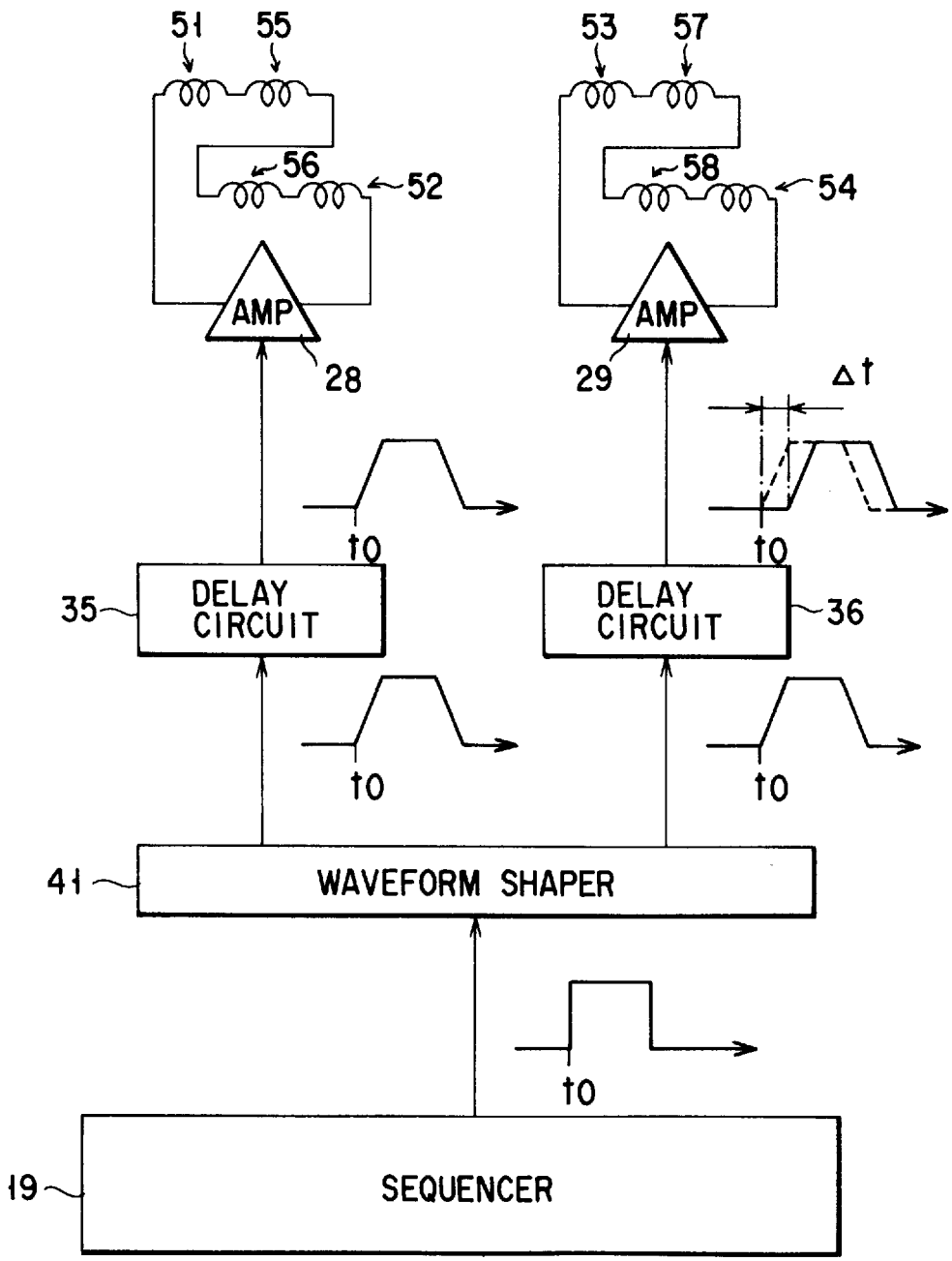
F I G. 6

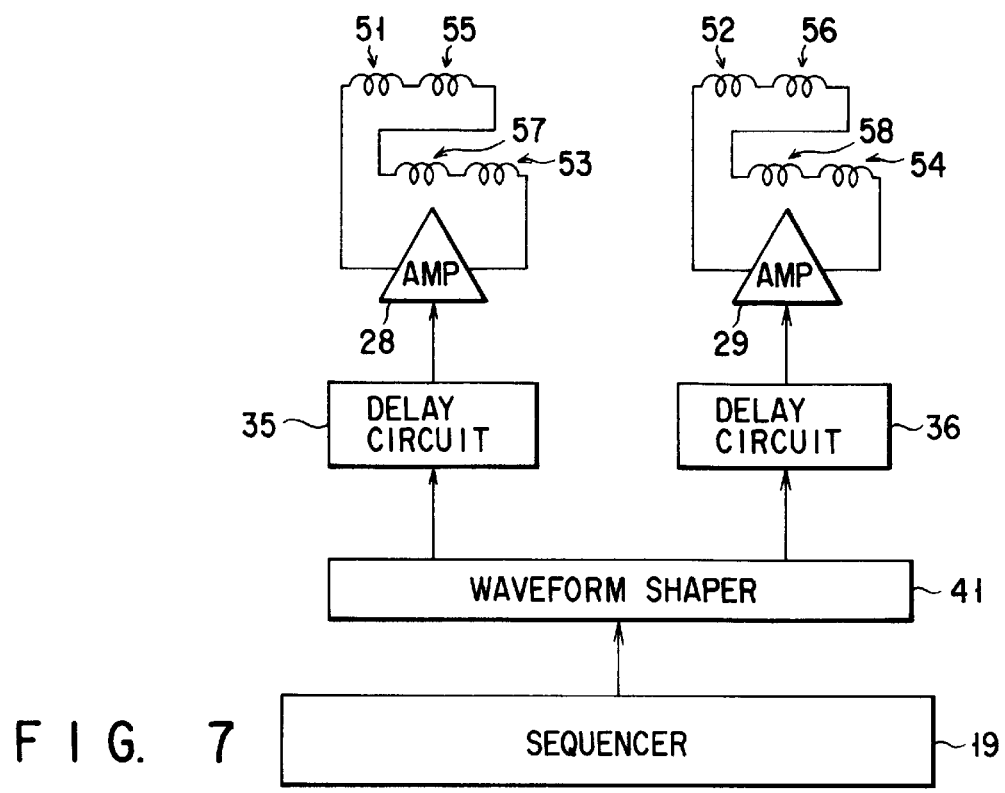
F I G. 7
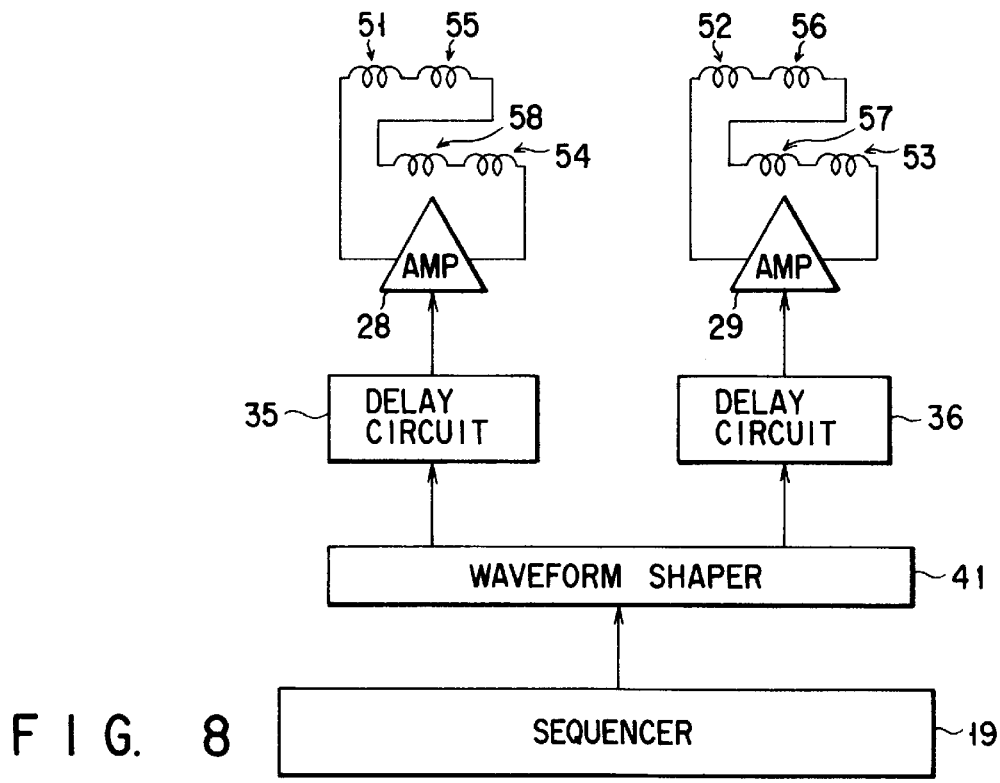
F I G. 8

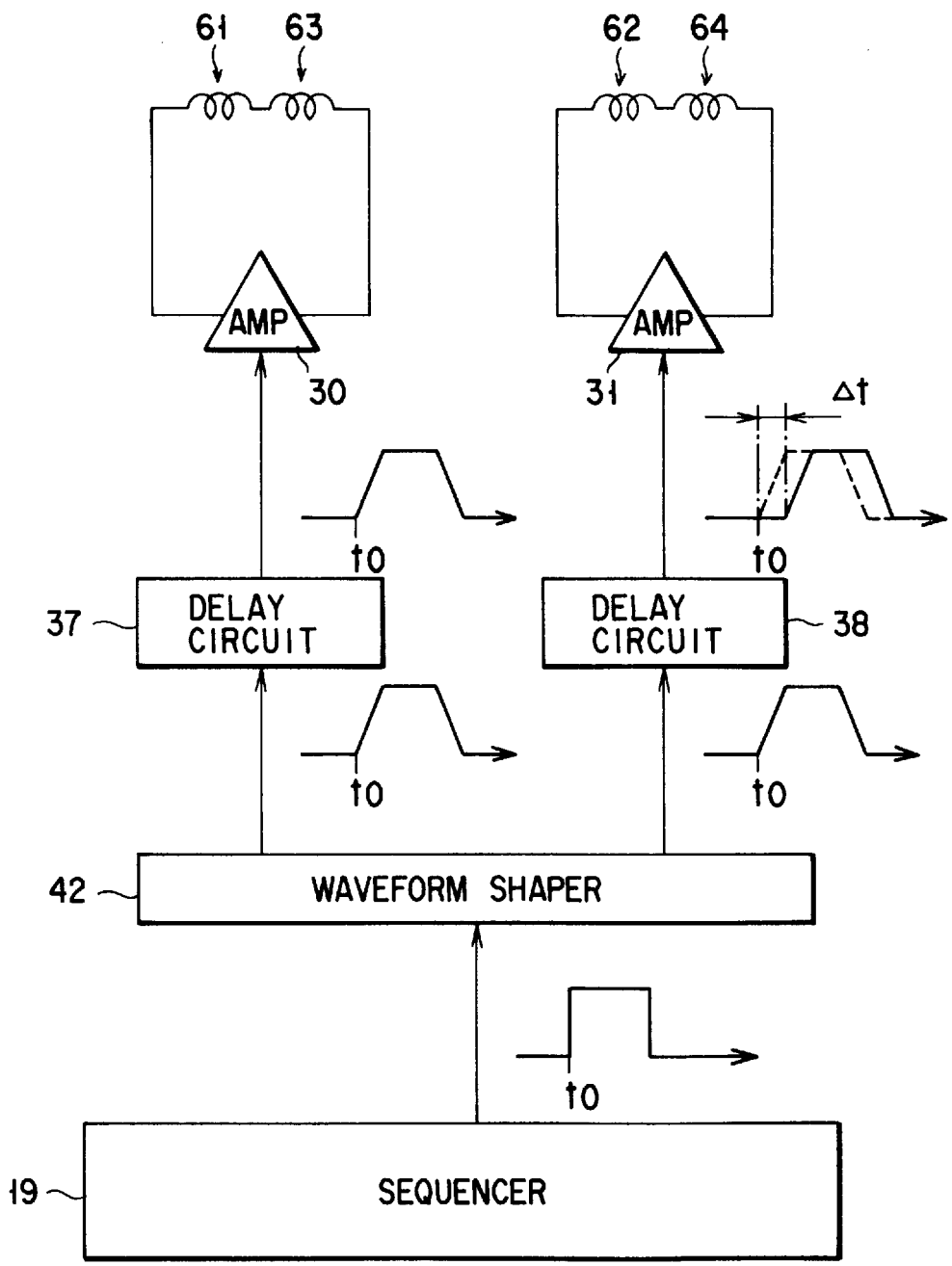
F I G. 12

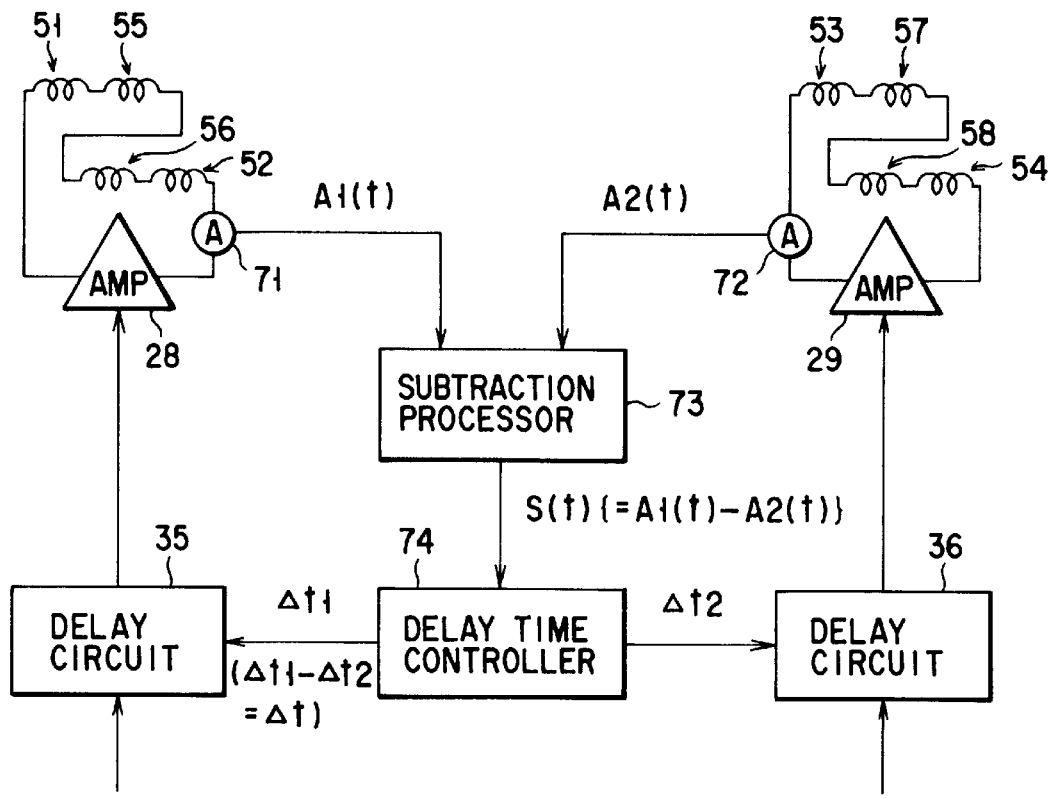
F I G. 13
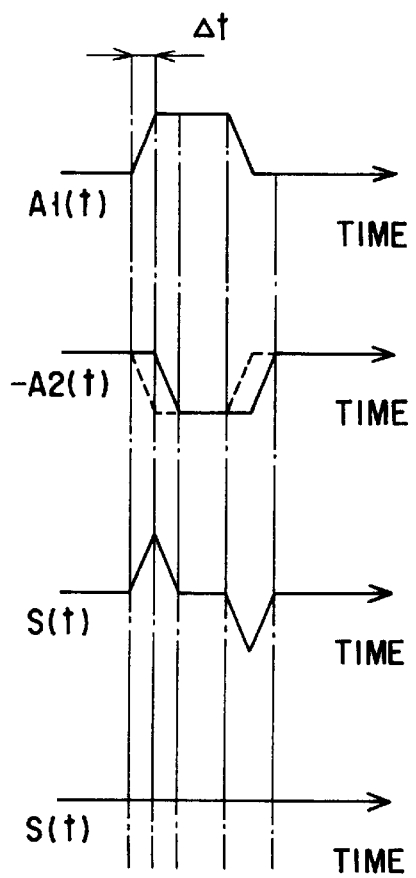
F I G. 14
F I G. 15
F I G. 16
F I G. 17

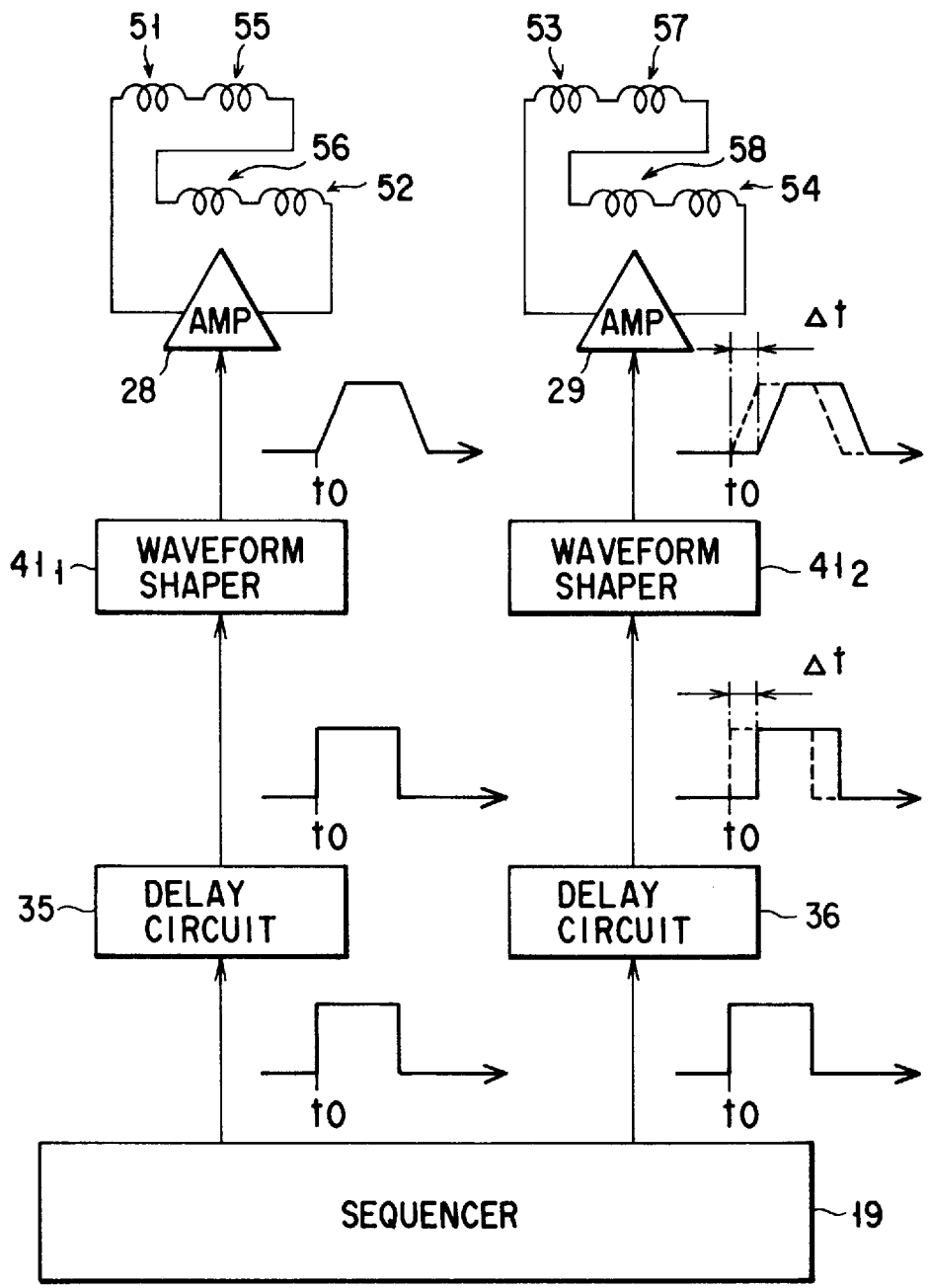
F I G. 19

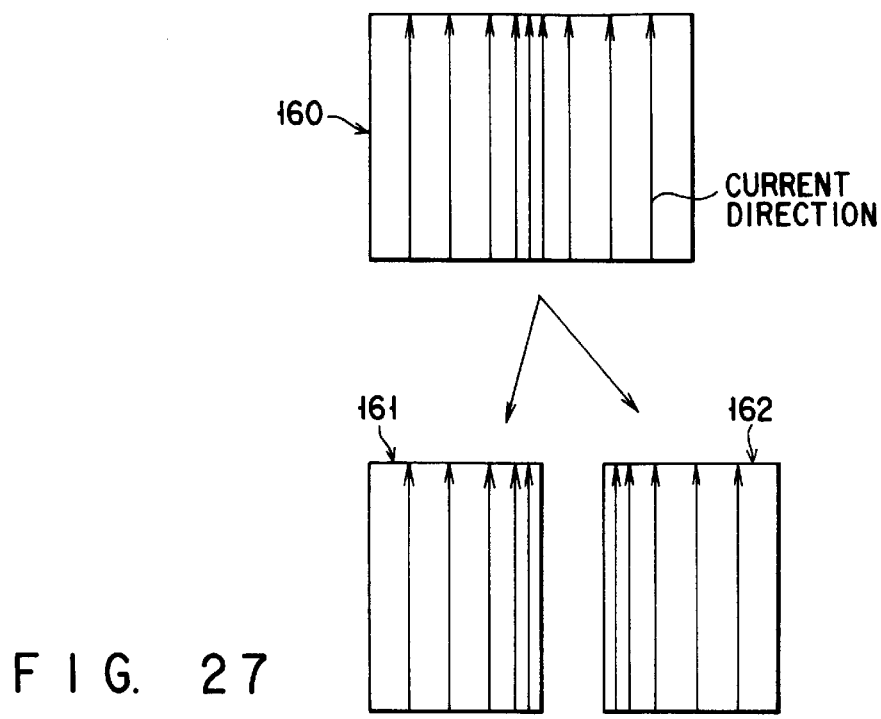
F I G. 27
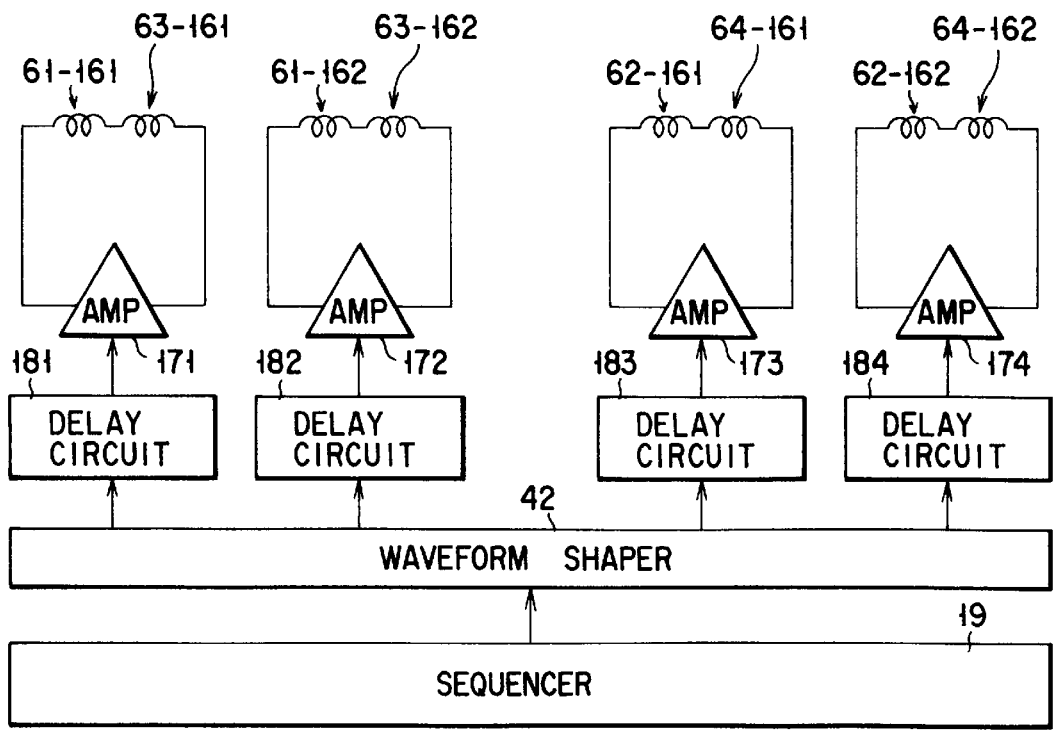
F I G. 28

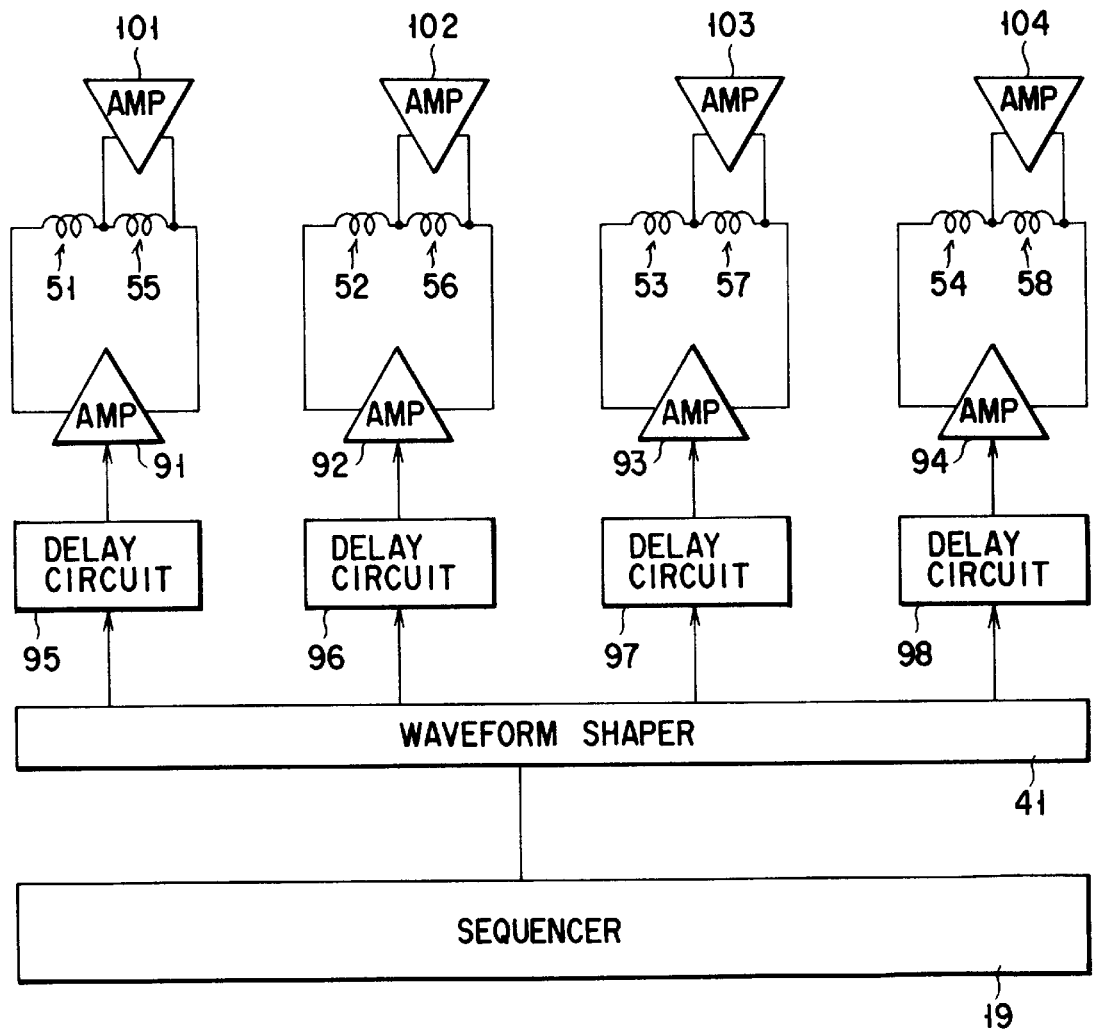
F I G. 29

MAGNETIC RESONANCE IMAGING APPARATUS

BACKGROUND OF THE INVENTION

1. Field of the Invention

The present invention relates to a magnetic resonance imaging apparatus for reconstructing a magnetic resonance image on the basis of magnetic resonance signals from nucleuses excited in a subject with a radiofrequency magnetic field.

2. Description of the Related Art

A gradient unit for producing gradient magnetic fields is one of the most important components in a magnetic resonance imaging apparatus.

The gradient unit has three coil sets and three amplifiers to allow formation of three independent gradient magnetic fields in three orthogonal axes (X, Y, and Z). An X-axis gradient magnetic field GX, a Y-axis gradient magnetic field GY, and a Z-axis gradient magnetic field GZ are used, in the form of independent magnetic fields or a synthetic magnetic field, as a readout gradient magnetic field (GR) for spatially encoding the frequency of a magnetic resonance signal, a phase encoding gradient magnetic field (GE) for spatially encoding the phase of the magnetic resonance signal, and a slice selection gradient magnetic field (GS) for selecting the imaging volume of a subject.

Gradient magnetic coils of each axis generally form pairs of coils arranged to form a magnetic field distribution such that the magnetic field strength of a gap (imaging region) between each pair of coils linearly changes. There is known a so-called active shielded gradient coil unit in which a magnetic shield coil for generating a magnetic field in a direction opposite to that of the magnetic field generated by a primary coil for gradient field generation is arranged outside the primary coil in order to suppress generation of an eddy current in a peripheral conductor upon leakage of this gradient magnetic field to the exterior. FIG. 1 shows a circuit for generating a gradient magnetic field of one axis. This circuit comprises main coils 1 to 4 for generating a gradient magnetic field, shield coils 5 to 8 for magnetically shielding, from the exterior, the magnetic field generated by the primary coils 1 to 4, and amplifiers for supplying currents to these coils. A very high-speed imaging method represented by an echo planar imaging method (EPI method) has recently been put into practice. This very high-speed imaging method can acquire, on the order of several tens of msec, a plurality of echoes required for reconstructing one magnetic resonance image and has a high industrial applicability.

A so-called standard spin echo method can raise a gradient magnetic field having a magnetic field strength of 10 mT/m in 1 msec. However, according to the EPI method, a gradient magnetic field having a strength of 30 mT/m must be raised in 0.1 msec and alternated at high speed. An active shielded gradient coil unit is an indispensable unit to prevent an eddy current from being generated from the peripheral conductor by this high-speed alternating magnetic field.

It is difficult to drive the serially connected primary coils 1 to 4 and the serially connected shield coils 5 to 8 by one amplifier 10 to raise, within a short period of time, the magnetic fields having a relatively high strength which satisfies the echo planar method. For example, an amplifier having a high output of 4 kV or more is required.

Employment of an amplifier having a higher output requires improvements such as prevention of magnetic coupling of surrounding metals and surrounding coils (a static magnetic field coil, static magnetic field correcting coil and the RF coil) with respect to the gradient coils.

The space between the primary coils and the shield coils can be increased to reduce the impedance of the gradient coil, thereby moderating the required specifications of the amplifier. This, however, is not preferable because a magnet gantry becomes bulky. The above problem of magnetic coupling can be solved by increasing the space between the gradient coils and the static magnetic field coil and the space between the gradient coils and the RF coil. However, the magnet gantry becomes undesirably bulky.

SUMMARY OF THE INVENTION

It is an object of the present invention to provide a magnetic resonance imaging apparatus using a gradient amplifier having a relatively low output enough to satisfy the requirements of a very high-speed imaging method such as an echo planar method.

In the magnetic resonance imaging apparatus, gradient magnetic fields and a radiofrequency magnetic field are applied to a subject placed in a static magnetic field to excite nucleuses and generate magnetic resonance signals. A magnetic resonance image is reconstructed on the basis of the magnetic resonance signals. The gradient magnetic field is produced by a gradient coil. In the high-speed imaging method such as the echo planar method requiring a high-speed alternating magnetic field, it is preferable that a shield coil for magnetically shielding, from the exterior, the magnetic field generated by the actively shielded gradient coil, i.e., the primary coil be used. It is very difficult to drive the primary coils and the shield coils by one amplifier to raise the gradient magnetic fields having a relatively high strength within a short period of time. The primary and shield coils are divided into a plurality of groups, and currents are individually supplied to the groups to allow rise of the gradient magnetic fields having a relatively high strength within a short period of time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a block diagram of a magnetic resonance imaging apparatus according to an embodiment of the present invention;

FIG. 3 is a view showing a structure of a Gy coil set in FIG. 2;

FIG. 4 is a view showing another structure of the Gy coil set in FIG. 2;

FIG. 5 is a view showing the pattern of one coil in FIG. 3 or 4;

FIG. 6 is a diagram showing grouping for dividing the Gy coil set in FIG. 2 into two groups, and changes in signals from a sequencer to amplifiers through a waveform shaper and delay circuits;

FIG. 7 is a diagram showing another grouping of the Gy coil set in FIG. 2;

FIG. 8 is a diagram showing still another grouping of the Gy coil set in FIG. 2;

FIG. 12 is a diagram showing grouping of the GZ coil set in FIG. 2 and changes in signals from a sequencer to amplifiers through a waveform shaper and delay circuits;

FIG. 13 is a diagram showing the arrangement of two delay circuits corresponding to the Gz coil set in FIG. 2;

FIG. 14 is a timing chart showing A1(t) in FIG. 13;

FIG. 15 is a timing chart showing A2(t) in FIG. 13;

FIG. 16 is a timing chart showing S(t) in FIG. 13;

FIG. 17 is a timing chart an ideal signal S(t) after delay time adjustment;

FIG. 19 is a view showing still another arrangement of waveform shapers and delay circuits corresponding to the Gy coil set in FIG. 2;

FIG. 27 is a view showing a coil pattern obtained when each coil of the Gz coil set in FIG. 2 is separated into two coil segments;

FIG. 28 is a diagram showing grouping for separating each coil of the Gz coil set in FIG. 2 into two coil segments and dividing the coils of the Gz coil set into four groups; and FIG. 29 is a diagram showing auxiliary amplifiers for the four groups in FIG. 21.

DETAILED DESCRIPTION OF THE PREFERRED EMBODIMENTS

Figure 1:
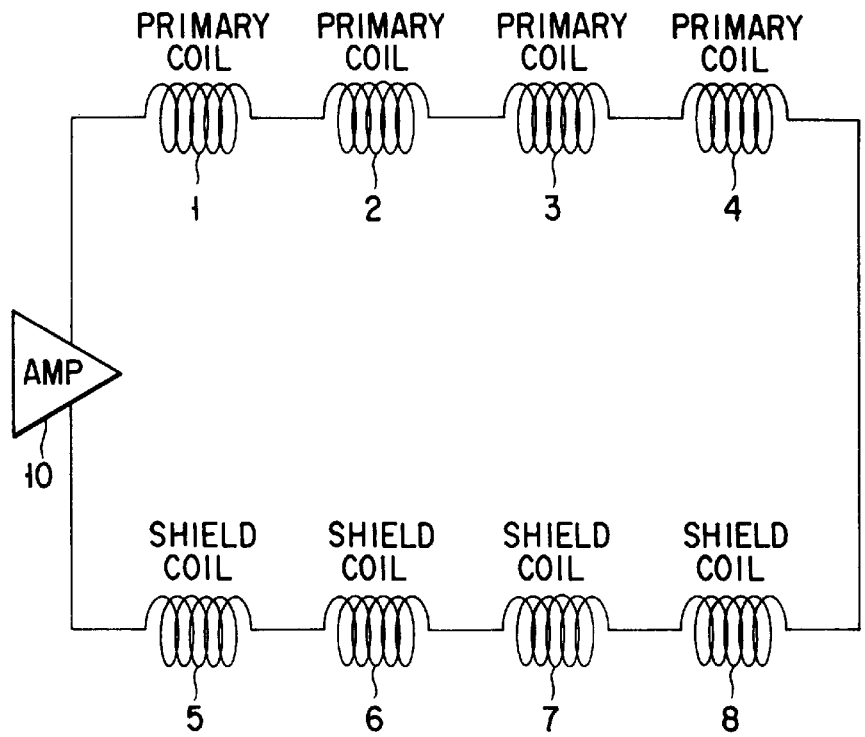
FIG. 1 is a circuit diagram of a conventional gradient coil unit.

Preferred embodiments of magnetic resonance imaging apparatuses of the present invention will be described with reference to the accompanying drawings.

FIG. 2 is a block diagram of a magnetic resonance imaging apparatus according to an embodiment of the present invention. A magnet gantry 11 has a static magnetic field coil 12 for producing a static magnetic field B0 in an imaging region. The static magnetic field coil 12 comprises a normal conducting coil or a superconducting coil. The static magnetic field coil 12 may be a permanent magnet.

For the descriptive convenience, three orthogonal axes (X-, Y-, and Z-axes) having the center of the imaging region as the origin are defined as follows. The Z-axis is parallel to the static magnetic field B0. The X-axis is perpendicular to the Z-axis, and the Y-axis is perpendicular to the X- and Z-axes.

The magnet gantry 11 has a radiofrequency coil 13 for generating a radiofrequency magnetic field to excite nucleuses in a subject placed in the image sensing area and detecting magnetic resonance signals from the excited nucleuses. Note that the radiofrequency coil 13 may comprise a single coil for generating the radiofrequency magnetic field and detecting the magnetic resonance signals, or may comprise a coil for generating the radiofrequency magnetic field and a coil for detecting the magnetic resonance signals.

The magnet gantry 11 has a gradient coil unit 14 for producing three gradient magnetic fields associated with the three orthogonal axes (X, Y, and Z) in the imaging region. The magnet gantry 11 also has a bed 15 for setting the subject in the image sensing area.

When the static magnetic field coil 12 comprises a normal conducting coil, a static magnetic field amplifier 20 continuously supplies a constant current to the static magnetic field coil 12 in order to continuously produce the static magnetic field B0 in the imaging region. When the static magnetic field coil 12 comprises a superconducting coil, a current continuously flows in the coil 12 unless the superconducting state is canceled, provided that the current is supplied once from the static magnetic field amplifier 20 to the static magnetic field coil 12. A transmitter 21 supplies a radiofrequency current to the radiofrequency coil 13 to generate a radiofrequency magnetic field. A receiver 22 detects magnetic resonance signals from the excited nucleuses through the radiofrequency coil 13. A processor 23 reconstructs a magnetic resonance image on the basis of the detected magnetic resonance signals. A display 24 displays the reconstructed magnetic resonance image.

The gradient coil unit 14 has an X-axis coil set (Gx coil set) for generating an X-axis gradient magnetic field, a Y-axis coil set (Gy coil set) for generating an Y-axis gradient magnetic field, and a Z-axis coil set (Gz coil set) for generating a Z-axis gradient magnetic field.

Each of these three coil sets has a plurality of primary coils for generating the corresponding gradient magnetic field and a plurality of shield coils for magnetically shielding, from the exterior, the magnetic field generated by the primary coils.

Note that coils are called a primary coil and a shield coil for the descriptive convenience, and the gradient magnetic field and shielding magnetic field are not produced by only the primary and shield coils, respectively.

A synthetic magnetic field produced by the behaviors of the primary and shield coils is the desired gradient magnetic field. The primary coil is mainly in charge of gradient magnetic field production in the imaging region, and the shield coil is mainly in charge of shielding for preventing the magnetic field from leaking to the exterior. The names of coils, i.e., the primary and shield coils are used for the above connotation.

The plurality of primary coils and the plurality of shield coils of each coil set are divided into a plurality of groups, i.e., the first and second groups. The first group consists of at least two coils selected from the plurality of primary coils and the plurality of shield coils, and preferably ½ (four coils) all the coils. The second group consists of remaining ones of the plurality of primary coils and the plurality of shield coils which are not included in the first group. Each group preferably has at least one primary coil and at least one shield coil. The plurality of coils included in each group are connected in series with each other. Assignment of the plurality of coils to the two groups will be described in detail later.

A gradient power supply 25 has a plurality (six) of amplifiers 26 to 31 so as to individually supply the currents to a plurality (six) of groups of the gradient coil unit 14. The amplifier 26 supplies the current to the first group of the X-axis coil set. The amplifier 27 supplies the current to the second group of the X-axis coil set. The amplifier 28 supplies the current to the first group of the Y-axis coil set. The amplifier 29 supplies the current to the second group of the Y-axis coil set. The amplifier 30 supplies the current to the first group of the Z-axis coil set. The amplifier 31 supplies the current to the second group of the Z-axis coil set.

The delay circuit group 32 has a plurality (six) of delay circuits 33 to 38. The plurality (six) of delay circuits 33 to 38 are arranged for the plurality (six) of groups of the gradient coil unit 14, respectively. A difference Δt between the delay times of each pair of delay circuits (33 and 34, 35 and 36, and 37 and 38) included in the coil sets of each axis is set to simultaneously generate the magnetic fields from the two groups. The difference between the generation timings of the magnetic fields from the two groups included in the same coil set is caused due to a slight difference between the impedances of the two groups and a characteristic difference between amplifiers.

A waveform shaper group 39 has three waveform shapers 40 to 42. The waveform shaper 40 shapes a rectangular wave signal (trigger signal), e.g., a trapezoidal wave signal from a sequencer 19 and simultaneously supplies the trapezoidal wave signals to the paired delay circuits (33 and 34) corresponding to X-axis. The waveform shaper 41 shapes a rectangular wave signal, e.g., a trapezoidal wave signal from the sequencer 19 and simultaneously supplies the trapezoidal wave signals to the paired delay circuits (35 and 36) corresponding to Y-axis. The waveform shaper 42 shapes a rectangular wave signal, e.g., a trapezoidal wave signal from the sequencer 19 and simultaneously supplies the trapezoidal wave signals to the paired delay circuits (37 and 38) corresponding to Z-axis.

The wave shapers 40 to 42 can also shape waveforms to compensate the waveform distortions caused by non-ideal characteristics of the apparatus.

To execute a pulse sequence according to, e.g., the echo planar method, the sequencer 19 supplies control signals to the transmitter 21, the receiver 22, and the waveform shaper group 39 in accordance with time diagram data.

A system controller 44 serves as a main control unit of the overall system. A console 43 is connected to the system controller to allow an operator to input various imaging conditions and various commands such as an imaging start command. The console 43 is connected to the bed 15 to slide and vertically move the bed 15.

FIG. 3 shows the structure of a general cylindrical Y-axis coil set. FIG. 4 shows the structure of a vertical Y-axis coil set. The Y-axis coil set may be of any scheme such as a cylindrical scheme, a vertical scheme, or any other scheme. FIG. 5 shows an example of the coil pattern of one coil shown in FIG. 3 or 4. The coil pattern is not limited to a spiral type as shown in FIG. 5.

The Y-axis coil set has four primary coils 51 to 54 and shield coils 55 to 58 in FIG. 3. The primary coils 51 and 53 are arrayed symmetrically about the X-Y plane along the Z-axis. The primary coils 52 and 54 are arrayed symmetrically about the X-Y plane along the Z-axis. The primary coils 51 and 52 face each other through the X-Z plane. The primary coils 53 and 54 face each other through the X-Z plane.

The shield coil 55 for mainly shielding, to the outside, the magnetic field generated by the primary coil 51 is located outside the primary coil 51. The shield coil 56 for mainly shielding, to the outside, the magnetic field generated by the primary coil 52 is located outside the primary coil 52. The shield coil 57 for mainly shielding, to the outside, the magnetic field generated by the primary coil 53 is located outside the primary coil 53. The shield coil 58 for mainly shielding, to the outside, the magnetic field generated by the primary coil 54 is located outside the primary coil 54.

The Y-axis coil set has four pairs of coils. The first pair consist of the primary coil 51 and the shield coil 55; the second pair, the primary coil 52 and the shield coil 56; the third pair, the primary coil 53 and the shield coil 57; and the fourth pair, the primary coil 54 and the shield coil 58. The primary and shield coils constituting one pair are coils having the shortest physical distance and the highest magnetic coupling strength. A given shield coil is selected such that an effect for shielding, to the outside, the magnetic field from the primary coil constituting the pair with the given shield coil is better than an effect for shielding the magnetic fields from the remaining primary coils.

The four primary coils 51 to 54 and the shield coils 55 to 58 are assigned to a plurality of groups in units of groups.

As shown in FIG. 6, the first group consists of the first pair (51 and 55) and the second pair (52 and 56), while the second group consists of the third pair (53 and 57) and the fourth pair (54 and 57).

Alternatively, as shown in FIG. 7, the first group may consist of the first pair (51 and 55) and the third pair (53 and 57), and the second group may consist of the second pair (52 and 56) and the fourth pair (54 and 58).

In addition, as shown in FIG. 8, the first group may consist of the first pair (51 and 55) and the fourth pair (54 and 58), and the second group may consist of the second pair (52 and 56) and the third pair (53 and 57).

The first amplifier 28 supplies the current to the two primary coils and the two shield coils which are included in the first group of the Y-axis coil set. The second amplifier 29 supplies the current to the two primary coils and the two shield coils which are included in the second group of the Y-axis coil set.

The X-axis coil set has four primary coils and four shield coils as in the Y-axis coil set and has a 90°-rotated structure of the Y-axis coil set about the Z-axis. Since the four primary coils and the four shield coils of the X-axis coil set are divided into two groups in the same manner as in grouping in the Y-axis coil set, a detailed description thereof will be omitted. The first amplifier 26 supplies the currents to the two primary coils and the two shield coils which are included in the first group of the X-axis coil set. The second amplifier 27 supplies the currents to the two primary coils and the two shield coils which are included in the second group of the X-axis coil set.

Figure 9:
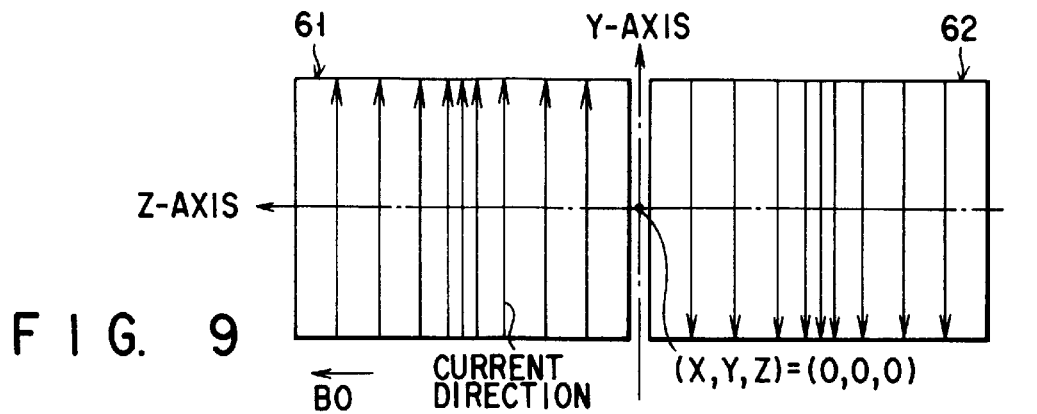
FIG. 9 is a view showing the primary coils in the Gz coil set in FIG. 2.
Figure 10:
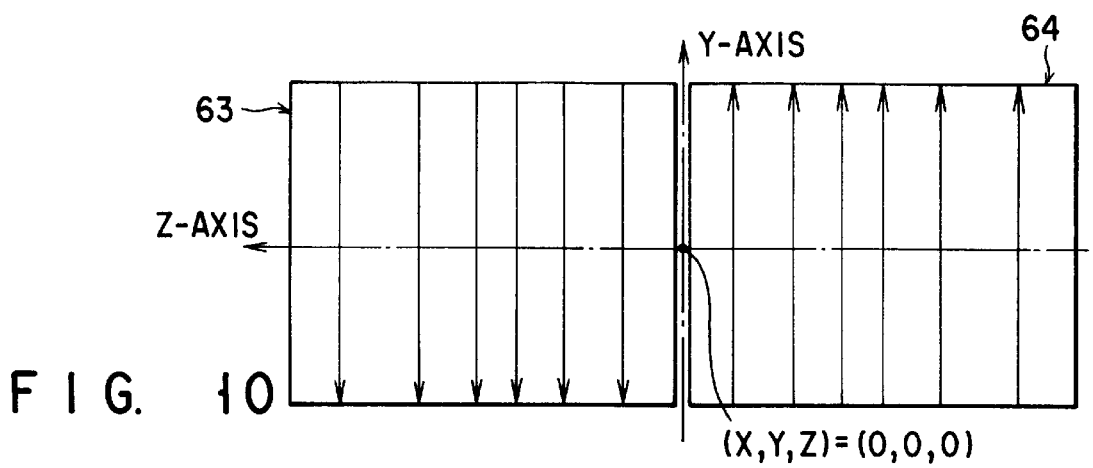
FIG. 10 is a view showing the structure of shield coils of the Gz coil set in FIG. 2.
Figure 11:
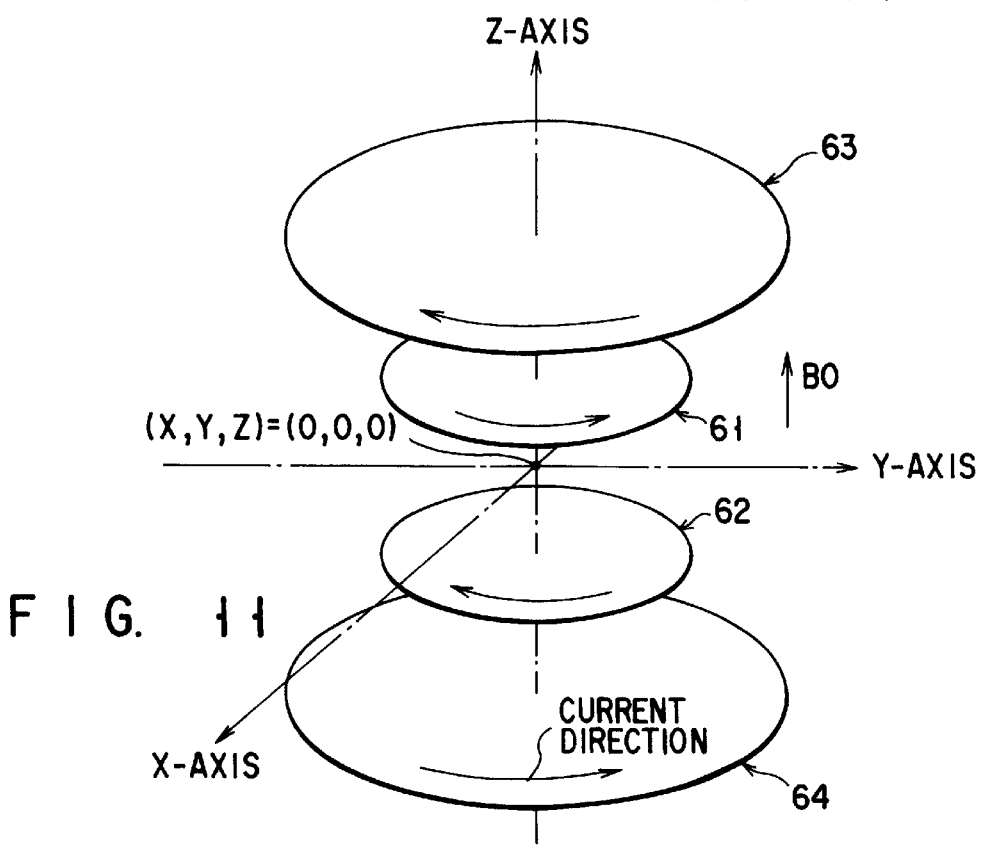
FIG. 11 is a view showing another structure of the Gz coil set in FIG. 2.

FIG. 9 shows two primary coils of a general cylindrical Z-axis coil set. FIG. 10 shows two shield coils of the general cylindrical Z-axis coil set. FIG. 11 shows two primary coils and two shield coils of a vertical Z-axis coil set. Each coil pattern is not limited to a solenoid or spiral type. The Z-axis coil set has two primary coils 61 and 62 and two shield coils 63 and 64. The primary coils 61 and 62 are arrayed symmetrically about the X-Y plane along the Z-axis. The shield coil 63 for mainly shielding, to the outside, the magnetic field generated by the primary coil 61 is located outside the primary coil 61. The shield coil 64 for mainly shielding, to the outside, the magnetic field generated by the primary coil 62 is located outside the primary coil 62.

The Z-axis coil set has two pairs. The first pair consist of the primary coil 61 and the shield coil 63. The second pair consist of the primary coil 62 and the shield coil 64. As shown in FIG. 12, the first group consist of one pair (61 and 63), while the second group consist of the other pair (62 and 64).

The first amplifier 30 supplies the currents to one primary coil and one shield coil which are included in the first group of the Z-axis coil set. The second amplifier 31 supplies the currents to one primary coil and one shield coil which are included in the second group of the Z-axis coil set.

As described above, a plurality of primary coils and a plurality of shield coils which are included in a coil set are divided into a plurality of groups. The current is supplied from each amplifier to the corresponding group. The impedance of one group is decreased when viewed from one amplifier. Therefore, a magnetic field having a high magnetic strength of 30 mT/m which is required by a very high-speed imaging method such as the echo planar method can be raised within a very short period of 0.1 msec even with a relatively low-end amplifier.

One pair consisting of one primary coil and one shield coil for mainly shielding the magnetic field generated by this primary coil are constituted by coils having the shortest physical distance and the highest magnetic coupling strength. In this manner, since the coils are grouped on the basis of this assumption, the impedance can be properly decreased.

Note that each coil set may be divided into a group consisting of only a primary coil or primary coils and a group consisting of only a shield coil or shield coils. In this case, to improve shielding precision, a current supplied to the shield coil must be set to be intentionally different from that supplied to the primary coil.

The difference Δt between the delay times of the delay circuit pairs (33 and 34, 35 and 36, and 37 and 38) included in the coil set of each axis will be described below. The arrangement of a unit for performing this setting is shown in FIG. 13. The circuits of the first and second groups are connected to ammeters 71 and 72, respectively. The ammeter 71 detects a time waveform A1(t) of a current flowing in the circuit of the first group (see FIG. 14). The ammeter 72 detects a time waveform A2(t) of a current flowing in the circuit of the second group (see FIG. 15).

A subtraction processor 73 subtracts A2(t) from A1(t) to calculate a difference waveform S(t). When these two groups have different magnetic field generation timings, the difference waveform S(t) has two spikes, as shown in FIG. 16. When the magnetic field generation timings of the two groups are perfectly synchronized with each other, the difference waveform S(t) is stabilized at zero, as shown in FIG. 17.

A delay time controller 74 adjusts a difference Δt between delay times Δt1 and Δt2 of the delay circuits so that the difference waveform S(t) becomes a state in FIG. 17 or is approximated to this state. This adjustment may be manually performed by the operator while the difference waveform S(t) is displayed on a display.

When variations are regarded absent upon setting the delay time, the ammeters 71 and 72, the subtraction processor 73, and the delay time controller 74 may be disconnected upon setting the delay time.

By this delay time adjustment, the magnetic fields can be simultaneously generated by the two groups.

The above embodiment can be modified as follows.

In the above description, each primary coil and each shield coil having the highest magnetic coupling strength with this primary coil are paired, and the coils are divided into groups on the basis of this grouping principle. However, a plurality of primary coils and a plurality of shield coils may be divided into a plurality of groups in accordance with arbitrary combinations regardless of the pairs. Alternatively, one group may be constituted by only a plurality of primary coils or only a plurality of shield coils. In this case, the magnitudes of currents supplied to the plurality of primary coils and the plurality of shield coils are adjusted to obtain an optimized shielding effect.

Figure 18:
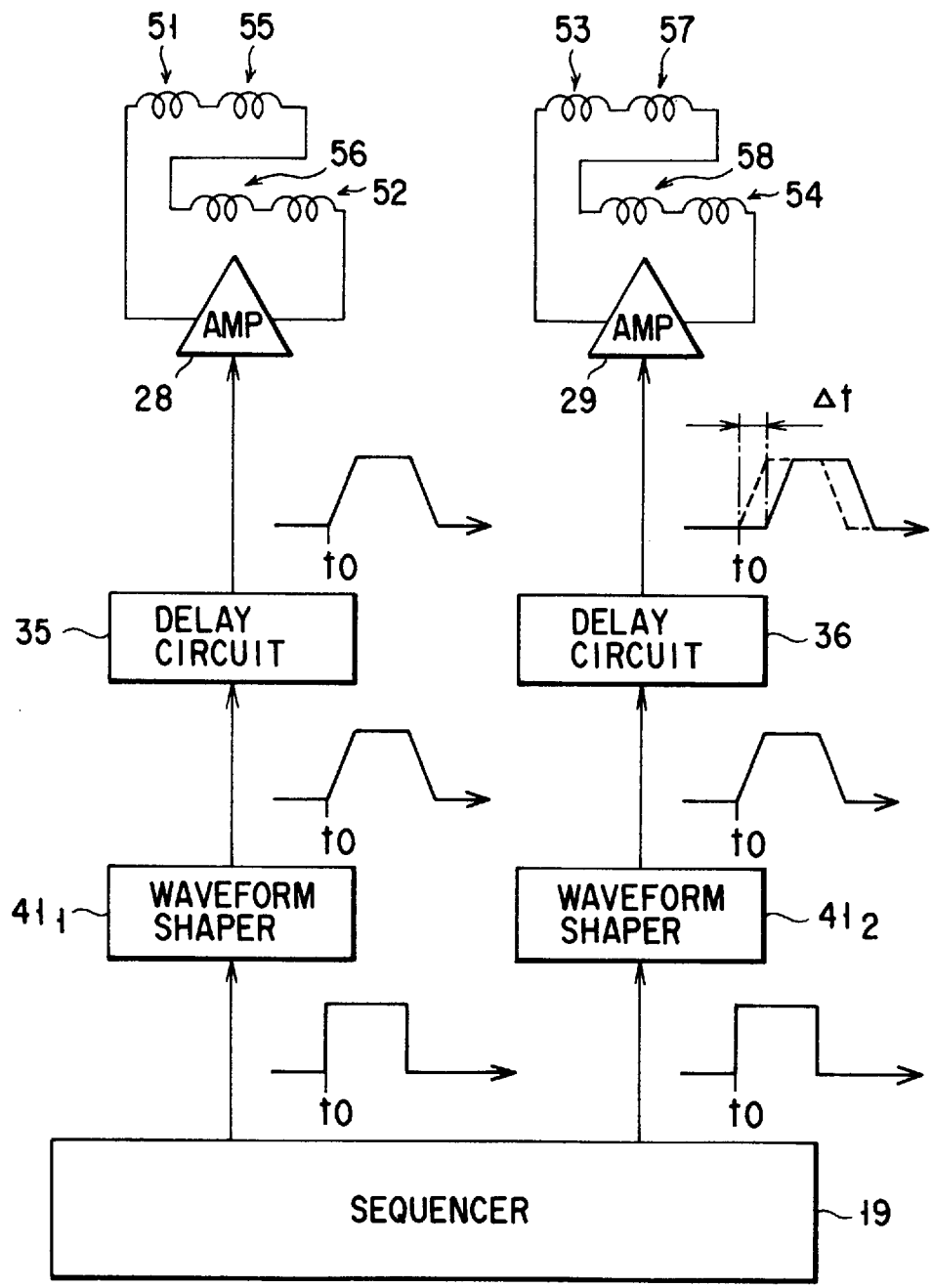
FIG. 18 is a view showing another arrangement of waveform shapers and delay circuits corresponding to the Gy coil set in FIG. 2.

In the above description, one waveform shaper 40 is shared by two groups included in one coil set. However, as shown in FIG. 18, waveform shapers 411 and 412 may be arranged for the two groups, respectively. Alternatively, as shown in FIG. 19, the positions of the delay circuits 35 and 36 and the waveform shapers 411 and 412 may be reversed. In this case, the rectangular wave signals from the sequencer 19 are delayed, and then waveform-shaped.

At least one delay circuit corresponding to at least one group (the delay times corresponding to the remaining groups are adjusted with reference to the magnetic field generation timing of this group) having the slowest magnetic field generation timing can be eliminated from the plurality of delay circuits corresponding to the coil sets of each axis.

To achieve the purpose of simultaneously generating the magnetic fields from the plurality of groups included in the coil set of each axis, the magnetic field generation timing of the fastest group is used as a reference to advance the timings of supplying control signals to the amplifiers corresponding to the slower groups in place of the signal delays described above.

The currents of the respective groups are measured to adjust the delay times in the above description. However, time changes in magnetic field strengths at the centers of the magnetic fields may be measured, and the delay times may be adjusted on the basis of the measurement values. If the magnetic fields of the respective groups are synchronously generated, the magnetic field strengths of the centers of the magnetic fields must be stabilized with the static magnetic field strength. Therefore, the delay times can be adjusted to stabilize the magnetic field strengths at the centers with the static magnetic field strength.

Figure 20:
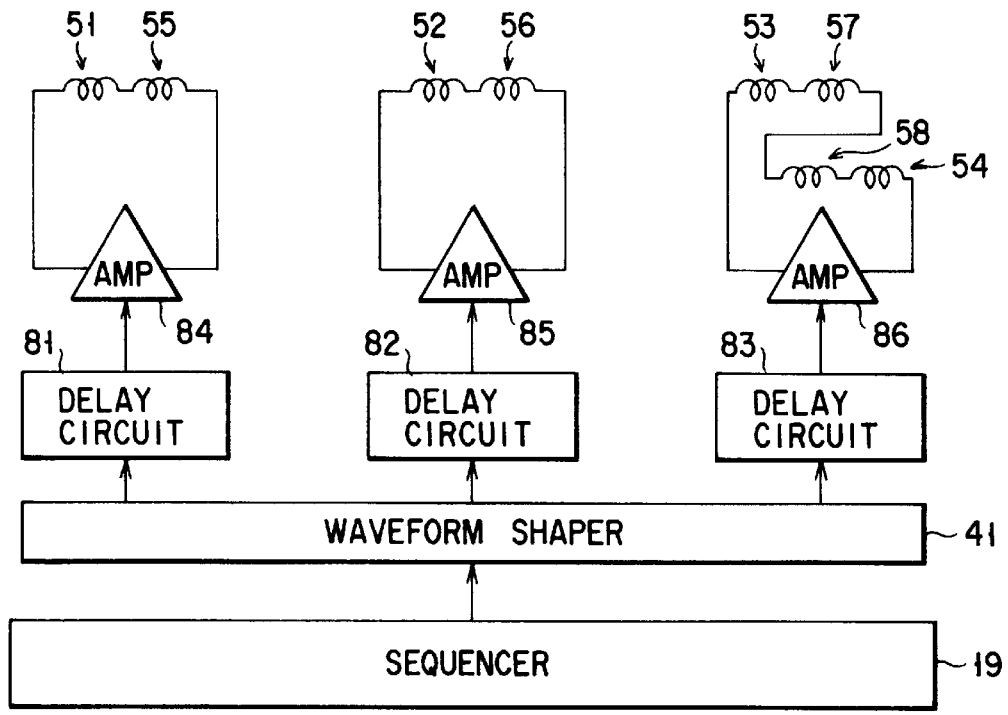
FIG. 20 is a diagram showing grouping for dividing the Gy coil set in FIG. 2 into three groups.

In the above description, the Y-axis coil set (X-axis coil set) is divided into the two groups. However, as shown in FIG. 20, the Y-axis coil set may be divided into three groups, and these three groups may be individually driven by three amplifiers 84 to 86. The four primary coils and the four shield coils are optimally assigned for the three groups in units of pairs, but assignment is not limited to this.

Figure 21:
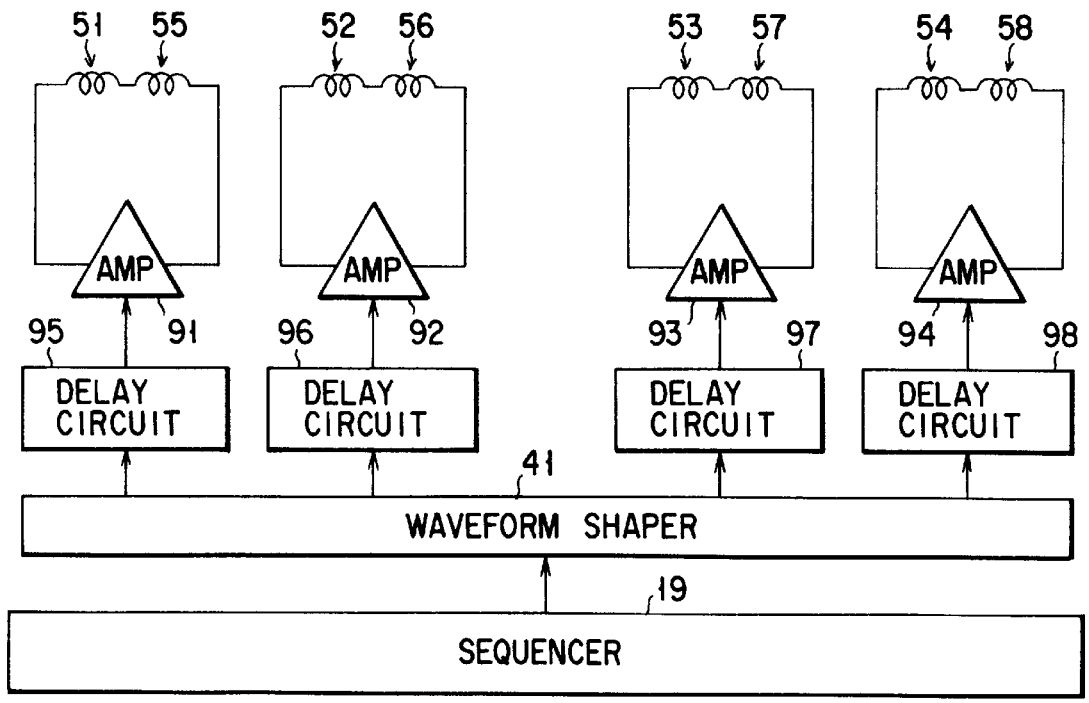
FIG. 21 is a diagram showing grouping for dividing the Gy coil set in FIG. 2 into four groups.

As shown in FIG. 21, the Y-axis coil set (X-axis coil set) may be divided into four groups, and these four groups may be individually driven by four amplifiers 91 to 94. The four primary coils and the four shield coils are optimally assigned for the four groups in units of groups each consisting of a given primary coil and a shield coil for mainly shielding, to the outside, the magnetic field generated by the given primary coil, but assignment is not limited to this.

Figure 22:
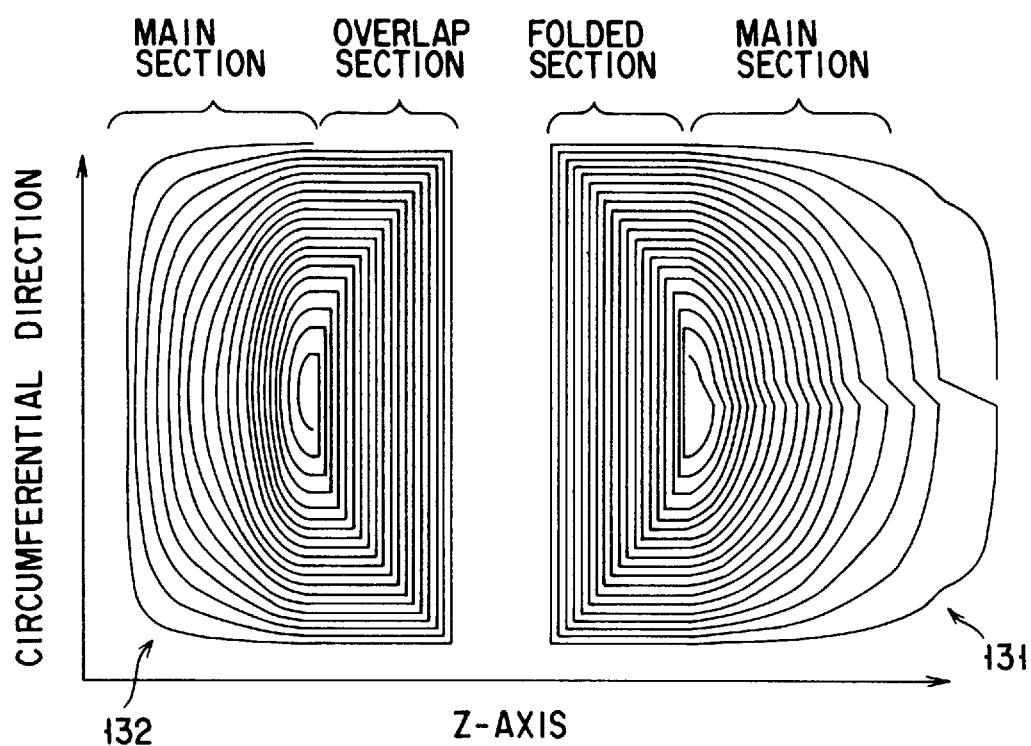
FIG. 22 shows a coil pattern obtained when each coil of the Gy coil set in FIG. 2 is separated into two coil segments.
Figure 23:
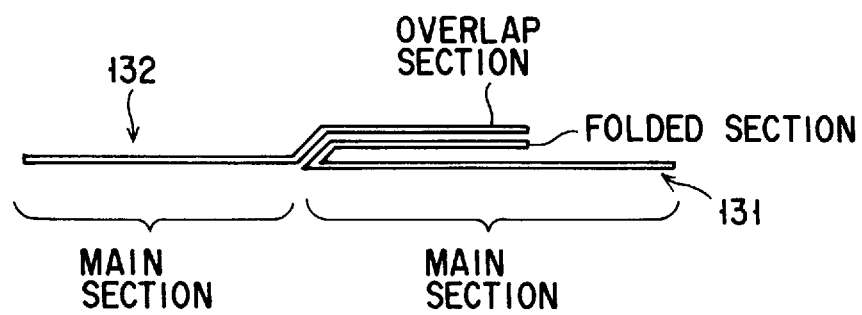
FIG. 23 is a side view of the two mounted coil segments shown in FIG. 22.

A plurality of primary coils and a plurality of shield coils which coaxially correspond to each other may be divided into a plurality (four or more) of groups, e.g., eight groups, and these groups may be individually driven. In this case, one coil is separated into, e.g., two coil segments. According to the first method, as shown in FIG. 22, one coil is separated into two coil segments 131 and 132 near the center of this coil with respect to the Z-axis. As shown in FIG. 23, the coil segments 131 and 132 are coupled to each other such that part of one coil segment 131 is folded, and part of the other coil segment 132 overlaps the folded section. By this overlap coupling, the magnetic field generated by the folded section of one coil segment 131 is canceled by the magnetic field generated by the overlap section of the other coil segment 132, and the distribution of the magnetic fields generated by the main sections of the two coil segments 131 and 132 is nearly equivalent to the distribution of a magnetic field generated by one coil shown FIG. 5.

Figures 24, 25:
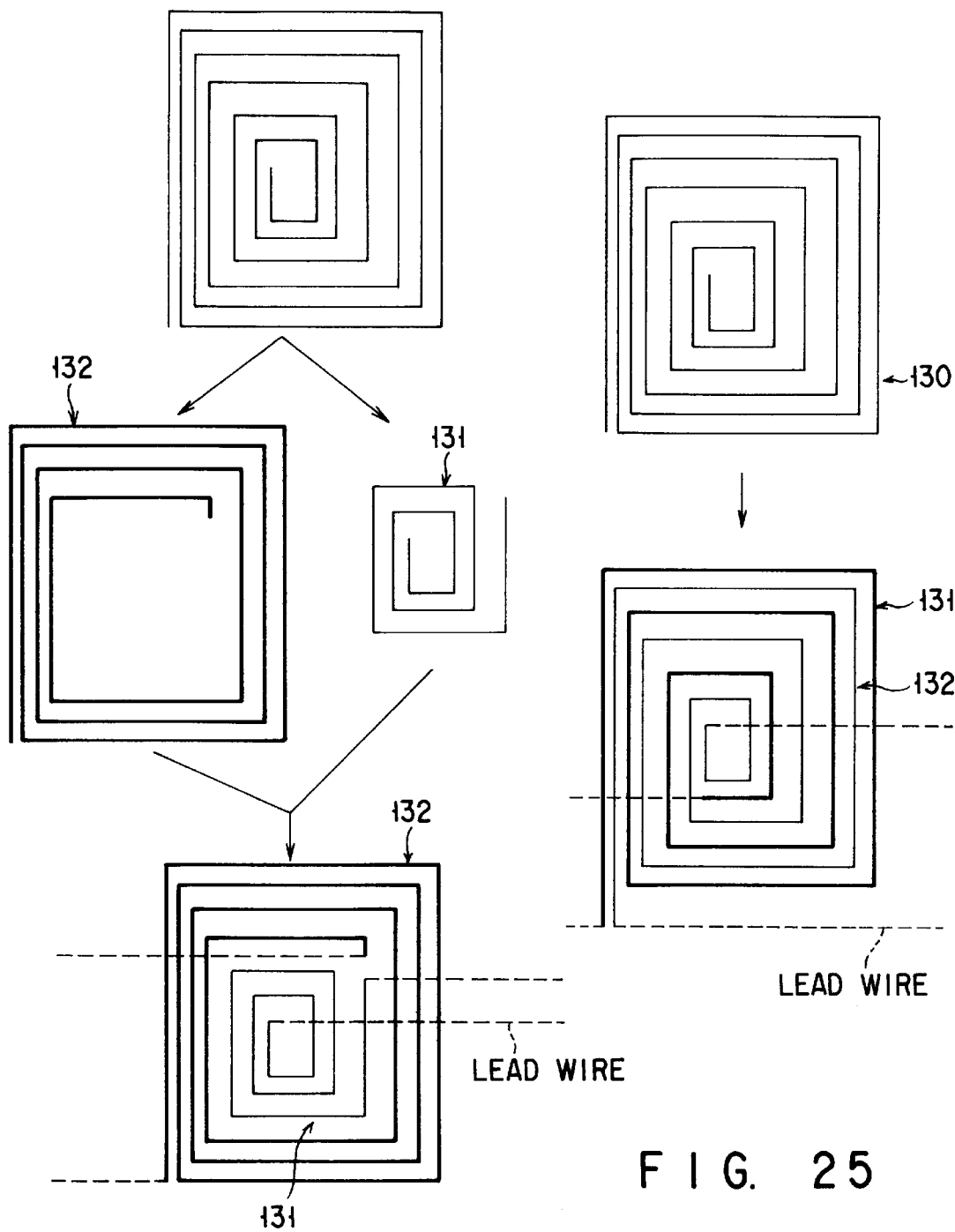
FIG. 24 is a view showing another coil pattern obtained when one coil is separated into two coil segments.
FIG. 25 is a view showing still another coil pattern obtained when one coil is separated into two coil segments.

According to the second method of separating one coil into two coil segments, as shown in FIG. 24, one coil is divided into a central coil segment 131 and a peripheral coil segment 132. According to the third method of separating one coil into two coil segments, as shown in FIG. 25, two coil segments 131 and 132 form a double spiral pattern. These coil separating methods shown in FIGS. 24 and 25 are free from the cumbersome connecting operation shown in FIG. 22.

Figure 26:
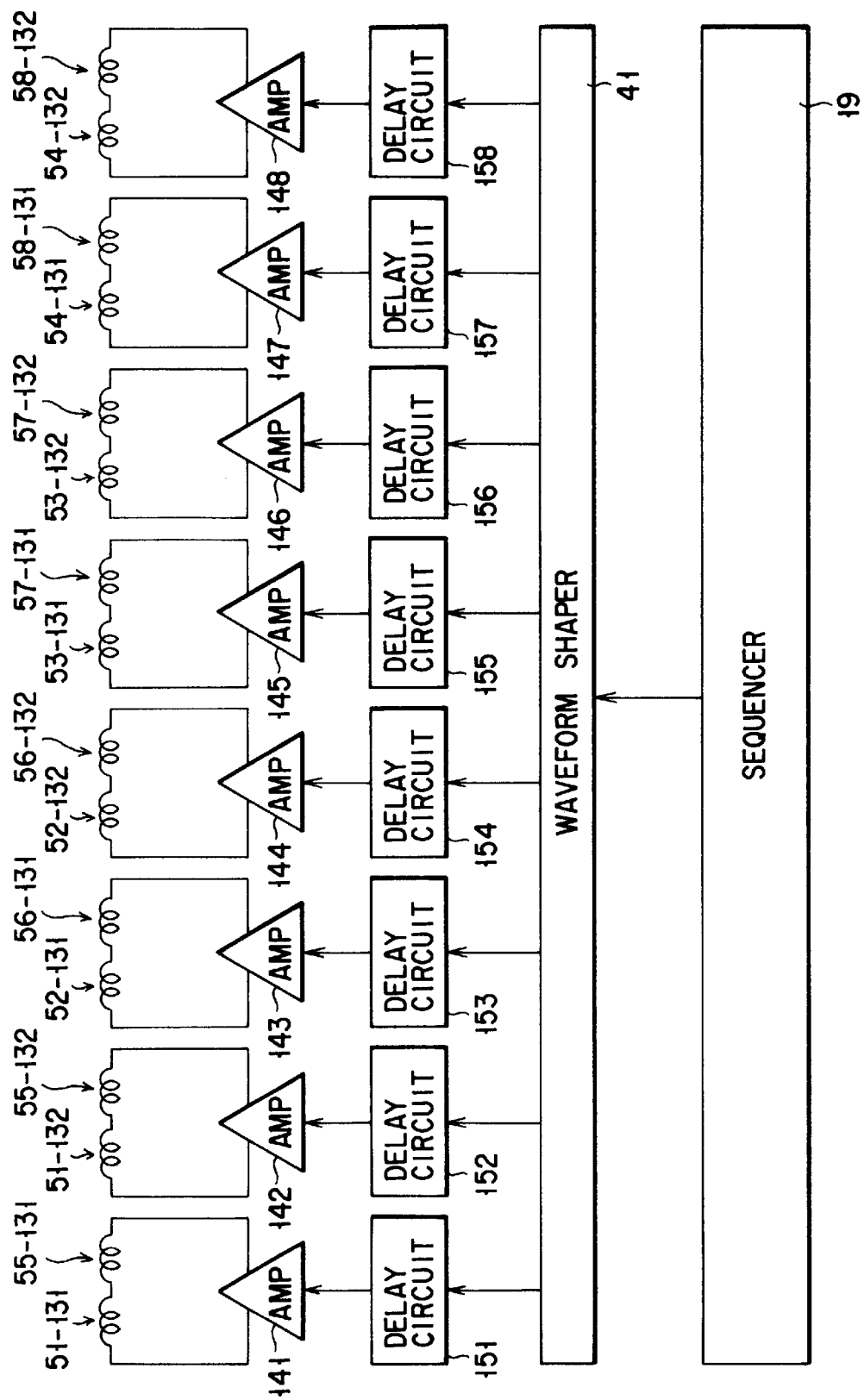
FIG. 26 is a diagram showing grouping for separating each coil of the Gy coil set in FIG. 2 into two coil segments and dividing the coils of the Gy coil set into eight groups.

As shown in FIG. 26, the four primary coils of the Y-axis coil set (X-axis coil set) are separated into eight coil segments 51-131, 52-131, 53-131, 54-131, 51-132, 52-132, 53-132, and 54-132, and the four shield coils are divided into eight coil segments 55-131, 56-131, 57-131, 58-131, 55-132, 56-132, 57-132, and 58-132. The Y-axis coil (X-axis coil set) set separated into a total of 16 coil segments is separated into a total of eight groups in which primary coil segments and shield coil segments for mainly shielding the magnetic fields generated by these primary coil segments are paired. Eight amplifiers 141 to 148 are arranged to individually drive the eight groups. Eight delay circuits 151 to 158 are arranged in correspondence with the eight amplifiers 141 to 148.

The coils of the Z-axis coil set can be separated into coil segments in the same manner as described above. As shown in FIG. 27, one solenoid coil is separated into two coil segments 161 and 162 at almost the center of this solenoid coil. Alternatively, the two coil segments 161 and 162 may be formed into a double spiral structure, thereby constituting one coil.

As shown in FIG. 28, the two primary coils of the Z-axis coil set are separated into four coil segments 61-161, 62-161, 61-162, and 62-162, and the two shield coils are separated into four coil segments 63-161, 64-161, 63-162, and 64-162. The Z-axis coil set separated into a total of 8 coil segments is separated into a total of eight groups in which primary coil segments and shield coil segments for mainly shielding the magnetic fields generated by these primary coil segments are paired. Four amplifiers 171 to 174 are arranged to individually drive the four groups, and four delay circuits 181 to 184 are arranged in correspondence with the four amplifiers 171 to 174.

The number of groups for separating the X-, Y-, and Z-axis coil sets and their assignment are not limited to the values described above and can be arbitrarily changed.

As shown in FIG. 29, currents to the four shield coils 55 to 58 may be corrected by four auxiliary amplifiers 101 to 104 to obtain a desired shielding effect. Auxiliary amplifiers may be arranged for the primary coils 51 to 54 to obtain a desired shielding effect.

As described above, according to the embodiments of the present invention, a plurality of primary coils and a plurality of shield coils are divided into a plurality of groups, and the plurality of groups are individually driven. The load impedance can be reduced to a fraction of the load impedance when viewed from one amplifier. Therefore, a magnetic field having a high magnetic strength of 30 mT/m which is required by a very high-speed imaging method such as the echo planar method can be raised within a very short period of 0.1 msec even with a relatively low-end amplifier.

The present invention is not limited to the particular embodiments described above. Various changes and modifications can be made within the spirit and scope of the invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus comprising:
   means for producing a static magnetic field in an imaging region;
   first gradient magnetic field generating means for producing a gradient magnetic field associated with a first axis in the imaging region;
   second gradient magnetic field generating means for producing a gradient magnetic field associated with a second axis in the imaging region;
   third gradient magnetic field generating means for producing a gradient magnetic field associated with a third axis in the imaging region;
   means for generating a radiofrequency magnetic field to excite nucleuses in a subject placed within the imaging region;
   means for detecting magnetic resonance signals from the excited nucleuses; and
   means for reconstructing a magnetic resonance image on the basis of the detected magnetic resonance signals,
   wherein at least one of said first, second and third gradient magnetic field generating means comprises:
   primary coils for producing the gradient magnetic field of the respective axis,
   shield coils for magnetically shielding the magnetic field generated by said primary coils, wherein the primary coils and shield coils are arranged to form a plurality of separate current paths, and
   a plurality of driving units each for individually supplying a separate current to one of the plurality of separate current paths.

2. An apparatus according to claim 1, wherein the number of the separate current paths is an even number.

3. An apparatus according to claim 1, wherein said primary coils and said shield coils are equally divided into the separate current paths.

4. An apparatus according to claim 1, wherein the number of the separate current paths is two.

5. An apparatus according to claim 4, wherein said primary coils and said shield coils are equally divided into the separate current paths.

6. An apparatus according to claim 1, wherein each of said shield coils is arranged to correspond with one of said primary coils for providing a shielding effect of a magnetic field generated by the corresponding primary coil that is larger than a shielding effect by said each shield coil of magnetic fields generated by remaining primary coils not corresponding to said each shield coil, and wherein said each shield coil is included in the same current path as that of said corresponding primary coil.

7. An apparatus according to claim 1, wherein said primary coils and said shield coils are arranged in different current paths.

8. An apparatus according to claim 1, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said second gradient magnetic field generating means are divided into first and second separate current paths such that the first current path is separated from the second current path through an X-Y plane.

9. An apparatus according to claim 1, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said third gradient magnetic field generating means are divided into first and second separate current paths such that the first current path is separated from the second current path through an X-Y plane.

10. An apparatus according to claim 1, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said first gradient magnetic field generating means are divided into first and second separate current paths such that the first current path is separated from the second current path through an X-Y plane.

11. An apparatus according to claim 1, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said second gradient magnetic field generating means are divided into first and second separate current paths such that the first current path is separated from the second current path through a Y-Z plane.

12. An apparatus according to claim 1, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said third gradient magnetic field generating means are divided into first and second separate current paths such that the first current path is separated from the second current path through a Y-Z plane.

13. An apparatus according to claim 1, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said second gradient magnetic field generating means are divided into first and second separate current paths such that the first current path is arranged in (+X,+Z) and (−X,−Z) regions, and the second current path is arranged in (−X,+Z) and (+X,−Z) regions.

14. An apparatus according to claim 1, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said third gradient magnetic field generating means are divided into first and second separate current paths such that the first current path is arranged in (+Y,+Z) and (−Y,−Z) regions, and the second current path is arranged in (−Y,+Z) and (+Y,−Z) regions.

15. An apparatus according to claim 1, further comprising:
means for simultaneously generating magnetic fields from the plurality of current paths.

16. An apparatus according to claim 1, further comprising:
means for shifting generation timings of the separate currents supplied by the driving units for simultaneously generating the magnetic fields from the plurality of current paths.

17. An apparatus according to claim 1, further comprising:
trigger means for generating individual trigger signals for individually triggering the driving units to supply the separate currents to the separate current paths, and
at least one delay circuit arranged between said trigger means and at least one of said plurality of driving units for delaying the trigger signal thereto to simultaneously generate magnetic fields from the plurality of current paths.

18. An apparatus according to claim 1, wherein at least one of said primary coils and said shield coils is separated into first and second coil segments such that part of said first coil segment is folded, and part of said second coil segment overlaps the folded part of said first coil segment.

19. An apparatus according claim 1, wherein at least one coil of said primary coils and said shield coils is separated into a first coil segment and a second coil segment arranged around said first coil segment.

20. An apparatus according to claim 1, wherein at least one coil of said primary coils and said shield coils is separated into a first coil segment and a second coil segment which forms a double spiral coil together with said first coil segment.

21. An apparatus according to claim 1, wherein at least one of said driving units further includes an auxiliary amplifier for correcting currents flowing in said shield coils in order to improve shielding precision.

22. A magnetic resonance imaging apparatus comprising:
means for producing a static magnetic field in an imaging region;
first gradient magnetic field generating means for producing a gradient magnetic field associated with a first axis in the imaging region;
second gradient magnetic field generating means for producing a gradient magnetic field associated with a second axis in the imaging region;
third gradient magnetic field generating means for producing a gradient magnetic field associated with a third axis in the imaging region;
means for generating a radiofrequency magnetic field to excite nucleuses of a subject placed in the imaging region;
means for detecting magnetic resonance signals from the excited nucleuses; and means for reconstructing a magnetic resonance image on the basis of the detected magnetic resonance signals, wherein at least one of said first, second and third gradient magnetic field generating means comprises:

primary coils for producing the gradient magnetic field of the respective axis, shield coils for magnetically shielding the magnetic field generated by said primary coils, wherein said primary coils and said shield coils are arranged to form a plurality of separate current paths each having at least one of said primary coils and at least one of said shield coils connected in series with said at least one primary coil, and a plurality of driving units each for individually supplying a separate current to one of the plurality of separate current paths.

23. An apparatus according to claim 22, wherein the number of the separate current paths is an even number.

24. An apparatus according to claim 22, wherein said primary coils and said shield coils are equally divided into the the separate current paths.

25. An apparatus according to claim 22, wherein the number of the separate current paths is two.

26. An apparatus according to claim 25, wherein said primary coils and said shield coils are equally divided into the separate current paths.

27. An apparatus according to claim 22, wherein each of said shield coils is arranged to correspond with one of said primary coils for providing a shielding effect of a magnetic field generated by the corresponding primary coil that is larger than a shielding effect by said each shield coil of magnetic fields generated by remaining primary coils not corresponding to said each shield coil, and wherein said each shield coil is included in the same current path as that of said corresponding primary coil.

28. An apparatus according to claim 22, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said second gradient magnetic field generating means are divided into first and second separate current paths such that the first current path is separated from the second current path through an X-Y plane.

29. An apparatus according to claim 22, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said third gradient magnetic field generating means are divided into first and second separate current paths such that the first current path is separated from the second current path through an X-Y plane.

30. An apparatus according to claim 22, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said first gradient magnetic field generating means are divided into first and second separate current paths such that the first current path is separated from the second current path through an X-Y plane.

31. An apparatus according to claim 22, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said second gradient magnetic field generating means are divided into first and second separate current paths such that the first current path is separated from the second current path through a Y-Z plane.

32. An apparatus according to claim 22, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said third gradient magnetic field generating means are divided into first and second separate current paths such that the first current path is separated from the second current path through a Y-Z plane.

33. An apparatus according to claim 22, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said second gradient magnetic field generating means are divided into first and second separate current paths such that the first current path is arranged in (+X,+Z) and (−X,−Z) regions, and the second current path is arranged in (−X,+Z) and (+X,−Z) regions.

34. An apparatus according to claim 22, wherein the first axis is a Z-axis parallel to a direction of the static magnetic field, the second axis is an X-axis perpendicular to the Z-axis, the third axis is a Y-axis perpendicular to the Z- and X-axes, and said primary coils and said shield coils of said third gradient magnetic field generating means are divided into first and second separate current paths such that the first current path is arranged in (+Y,+Z) and (−Y,−Z) regions, and the second current path is arranged in (−Y,+Z) and (+Y,−Z) regions.

35. An apparatus according to claim 22, further comprising:

means for simultaneously generating magnetic fields from the plurality of current paths.

36. An apparatus according to claim 22, further comprising:

means for shifting generation timings of the separate currents supplied by the driving units for simultaneously generating the magnetic fields from the plurality of current paths.

37. An apparatus according to claim 22, further comprising:

trigger means for generating individual trigger signals for individually triggering the driving units to supply the separate currents to the separate current paths, and at least one delay circuit arranged between said trigger means and at least one of said plurality of driving units for delaying the trigger signal thereto to simultaneously generate magnetic fields from the coils forming the plurality of current paths.

38. An apparatus according to claim 22, wherein at least one of said primary coils and said shield coils is separated into first and second coil segments such that part of said first coil segment is folded, and part of said second coil segment overlaps the folded part of said first coil segment.

39. An apparatus according claim 22, wherein at least one coil of said primary coils and said shield coils is separated into a first coil segment and a second coil segment arranged around said first coil segment.

40. An apparatus according to claim 22, wherein at least one coil of said primary coils and said shield coils is separated into a first coil segment and a second coil segment which forms a double spiral coil together with said first coil segment.

41. An apparatus according to claim 22, wherein at least one of said driving units further includes an auxiliary amplifier for correcting currents flowing in said shield coils in order to improve shielding precision.

42. A magnetic resonance imaging apparatus comprising:

means for producing a static magnetic field in an imaging region;

first gradient magnetic field generating means for producing a gradient magnetic field associated with a first axis in the imaging region;

second gradient magnetic field generating means for producing a gradient magnetic field associated with a second axis in the imaging region;

third gradient magnetic field generating means for producing a gradient magnetic field associated with a third axis in the imaging region;

means for generating a radiofrequency magnetic field to excite nucleuses of a subject placed in the imaging region;

means for detecting magnetic resonance signals from the excited nucleuses; and means for reconstructing a magnetic resonance image on the basis of the detected magnetic resonance signals, wherein at least one of said first, second and third gradient magnetic field generating means comprises:

a plurality of separate current paths each having at least one primary coil for producing the gradient magnetic field and at least one shield coil connected in series with said at least one primary coil and adapted to shield the magnetic field generated by said at least one primary coil, and a plurality of driving units each for individually supplying a separate current to one of the plurality of separate current paths.

* * * * *

UNITED STATES PATENT AND TRADEMARK OFFICE
CERTIFICATE OF CORRECTION

PATENT NO. : 5,867,027
DATED : February 2, 1999
INVENTOR(S) : Hiromi Kawamoto

It is certified that error appears in the above-identified patent and that said Letters Patent is hereby corrected as shown below:

On the title page, Item [30] should read:
[30] Foreign Application Priority Data
July 23, 1996 [JP]     Japan............8-193476
July 27, 1995 [JP]     Japan............7-191612

Signed and Sealed this

Third Day of August, 1999

Attest:

Attesting Officer

Q. TODD DICKINSON

Acting Commissioner of Patents and Trademarks